(12) United States Patent
Li et al.

(10) Patent No.: US 8,633,069 B2
(45) Date of Patent: Jan. 21, 2014

(54) ARRAY SUBSTRATE AND MANUFACTURING METHOD THEREOF, ACTIVE DISPLAY

(75) Inventors: Wenbo Li, Beijing (CN); Gang Wang, Beijing (CN); Zhuo Zhang, Beijing (CN); Yanbing Wu, Beijing (CN)

(73) Assignee: Boe Technology Group Co., Ltd., Beijing (CN)

(*) Notice: Subject to any disclaimer, the term of this patent is extended or adjusted under 35 U.S.C. 154(b) by 141 days.

(21) Appl. No.: 13/292,320

(22) Filed: Nov. 9, 2011

(65) Prior Publication Data

US 2012/0112195 A1   May 10, 2012

(30) Foreign Application Priority Data

Nov. 10, 2010 (CN) .......................... 2010 1 0540705

(51) Int. Cl.
*H01L 21/00* (2006.01)
*H01L 21/84* (2006.01)
*H01L 27/14* (2006.01)
*H01L 29/04* (2006.01)
*H01L 29/15* (2006.01)
*H01L 31/036* (2006.01)

(52) U.S. Cl.
USPC ...................... 438/158; 257/72; 257/E21.025

(58) Field of Classification Search
USPC ............ 438/34, 48, 149, 158–159, 669, 438/FOR. 201; 257/59, 72, E21.411, 257/E29.273, E21.158, E21.023, E21.025, 257/E21.034

See application file for complete search history.

(56) References Cited

U.S. PATENT DOCUMENTS

| 2007/0275512 A1* | 11/2007 | Jee et al. .................... 438/149 |
| 2008/0164470 A1* | 7/2008 | Wang et al. ................ 257/59 |
| 2010/0012945 A1* | 1/2010 | Zheng et al. ............... 257/72 |

* cited by examiner

*Primary Examiner* — Daniel Luke
*Assistant Examiner* — Khaja Ahmad
(74) *Attorney, Agent, or Firm* — Ladas & Parry LLP (57) ABSTRACT

A manufacturing method for an array substrate comprising: sequentially forming a gate metal film, a gate insulating layer and an active layer film; applying photoresist, and patterning the photoresist; etching the stacked layers corresponding to a photoresist-completely-removed region; ashing to remove the photoresist in a photoresist-partially-remained region and remain a part of photoresist in a photoresist-completely-remained region, etching the gate insulating layer and the active layer film in the photoresist-partially-remained region; forming an insulating layer film; lifting off the photoresist and the insulating layer film thereon; forming a conductive film, and patterning the conductive film to from a source electrode, a drain electrode, a data line, a pixel electrode and an active layer channel.

7 Claims, 10 Drawing Sheets

ARRAY SUBSTRATE AND MANUFACTURING METHOD THEREOF, ACTIVE DISPLAY

BACKGROUND

Embodiments of the disclosed technology relate to an array substrate, a manufacturing method thereof and an active display.

An electronic paper display is a display device having the advantages of both the display and the paper such as flexible displaying, portability, being erasable, low power consumption and the like, and it has a displaying performance close to papers.

Active electronic paper displays mainly each comprise an upper substrate, an electronic ink layer (displaying medium) and a lower substrate. Most of the active electronic paper displays are reflection type displayers which do not need backlight and display images by reflecting the environmental light source. Generally, a common electrode is formed on the upper substrate, and the lower substrate is an array substrate providing an active driving for the electronic paper devices. Because the active electronic paper displayers do not need backlight, the array substrate can be designed as a reflection type. A typical structure of the array substrate in the prior art comprises a base substrate, data lines and gate lines which are formed on the base substrate and crossed with each other so defined a plurality of pixel units arranged in a matrix. Each of the pixel units comprises a thin film transistor (TFT) switch and a pixel electrode. The TFT switch comprises a gate electrode, a source electrode, a drain electrode and an active layer. The gate electrode is connected with a corresponding gate line, the source electrode is connected with a corresponding data line, and the drain electrode is connected with the pixel electrode. The active layer is formed between the source/drain electrodes and the gate electrode. Generally, a common electrode line for supplying a common voltage to the common electrode is provided on the base substrate.

The conductive patterns on the current array substrate are generally made by a 5-Mask or a 4-Mask process, which is disadvantage due to complex manufacturing procedures and high cost. In addition, a certain electric field is formed between the data lines, the gate lines, the TFT switch and the displaying medium, and the electric filed can influence the displaying medium above the data lines, the gate lines and the TFT switch. For example, the upper substrate of the active electronic paper display is not provided with a black matrix, and the data lines, gate lines and the TFT switch exert an obvious interference on the displaying medium thereon, which reduces the displaying quality.

SUMMARY

An embodiment of the disclosed technology provides a manufacturing method for an array substrate, comprising: Step 1, sequentially forming a gate metal film, a gate insulating layer and an active layer film; Step 2, applying a layer of photoresist on the active layer film, and exposing and developing the photoresist by a double tone mask so as to form a photoresist-completely-remained region, a photoresist-partially-remained region and a photoresist-completely-removed region, the photoresist-completely-remained region corresponding to a region for a gate electrode and an active layer, the photoresist-partially-remained region corresponding to a region for a gate line and a common electrode line, and the photoresist-completely-removed region corresponds to other regions on the array substrate; Step 3, performing a first etching on the gate metal film, the gate insulating layer and the active layer film corresponding to the photoresist-completely-removed region, so as to form the gate electrode and the active layer; Step 4, ashing to remove the photoresist in the photoresist-partially-remained region and remain a part of photoresist with a certain thickness in the photoresist-completely-remained region, performing a second etching on the gate insulating layer and the active layer film in the photoresist-partially-remained region so as to faun the gate line and the common electrode line; Step 5, forming a first insulating layer film on the first base substrate after Step 4; Step 6, lifting off the photoresist in the photoresist-completely-remained region and the first insulating layer film thereon; Step 7, forming a first conductive film on the first insulating layer film and the active layer, and patterning the first conductive film by a patterning process so as to from a source electrode, a drain electrode, a data line, a pixel electrode and an active layer channel; and Step 8, forming a passivation layer on the base substrate after the Step 7.

Another embodiment of the disclosed technology provides an array substrate, comprising: a first base substrate; data lines and gate lines which are formed on the first base substrate and crossed with each other so as to define pixel units, each of the pixel units comprising a pixel electrode, a gate electrode, a common electrode line, a source electrode, a drain electrode and an active layer, and a gate insulating layer formed between the gate electrode and the active layer; and a passivation layer covering the data line, the source electrode, the drain electrode and the active layer; wherein, the gate electrode is formed on the first base substrate, and the gate insulating layer, the active layer and the gate electrode have the same planar shape and are formed integrally and synchronously; a first insulating layer formed on the based substrate formed with the gate electrode, the gate insulating layer and the active layer; and the gate electrode, the gate insulating layer and the active layer are surrounded by the first insulating layer; at the adjacent portions of the first insulating layer and the active layer, the surface of the first insulating layer being level with the surface of the active layer; the source electrode, the drain electrode, the data line and the pixel electrode are formed on the first insulating layer and the active layer.

Still another embodiment of the disclosed technology provides an active display, comprising: an upper substrate and the array substrate according to any embodiment of the disclosed technology, the upper substrate and the array substrate being bonded with each other, and a displaying medium interposed between the upper substrate and the array substrate.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein:

FIG. 4-0 is a cross-sectional view of a structure after a passivation layer is formed in a manufacturing method for an array substrate according to a fourth embodiment of the disclosed technology;

FIG. 4 is a cross-sectional view of a structure after a passivation layer is formed in a manufacturing method for an array substrate according to a fourth embodiment of the disclosed technology;

FIG. 5B-0 is a cross-sectional view taken along a line A-A in FIG. 5A before a second conductive layer used for forming the common electrode contact layer is etched;

FIG. 5B is a cross-sectional view taken along a line A-A in FIG. 5A.

DETAILED DESCRIPTION

The disclosed technology now will be described more clearly and fully hereinafter with reference to the accompanying drawings, in which the embodiments of the disclosed technology are shown. Apparently, only some embodiments of the disclosed technology, but not all of embodiments, are set forth here, and the disclosed technology may be embodied in other forms. All of other embodiments made by those skilled in the art based on embodiments disclosed herein without mental work fall within the scope of the disclosed technology.

First Embodiment

A manufacturing method for an array substrate according to the first embodiment of the disclosed technology comprises the following steps.

Figure 1A:
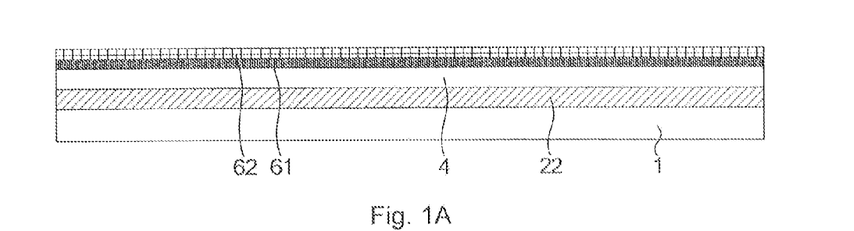
FIG. 1A is a cross-sectional view of the structure after a gate metal film, a gate insulating layer and an active layer film are formed in a manufacturing method for an array substrate according to a first embodiment of the disclosed technology.

Step 101, sequentially forming a gate metal film, a gate insulating layer and an active layer film;

FIG. 1A is a cross-sectional view of a gate metal film, a gate insulating layer and an active layer film formed in the manufacturing method for the array substrate according to the first embodiment of the disclosed technology. The gate metal film 22 can be deposited on a first base substrate 1 by a sputtering process, and then a gate insulating layer 4, a semiconductor layer 61 and a doped semiconductor layer 62 are deposited sequentially by a chemical vapor deposition (CVD). The semiconductor layer 61 and the doped semiconductor layer 62 constitute the active layer film.

Step 102, applying a layer of photoresist on the active layer film, and exposing and developing the photoresist by a double tone mask so as to form a photoresist-completely-remained region, a photoresist-partially-remained region and a photoresist-completely-removed region. The photoresist-completely-remained region corresponds to a region for a gate electrode and an active layer, the photoresist-partially-remained region corresponds to a region for a gate line and a common electrode line, and the photoresist-completely-removed region corresponds to other regions.

Figure 1B:
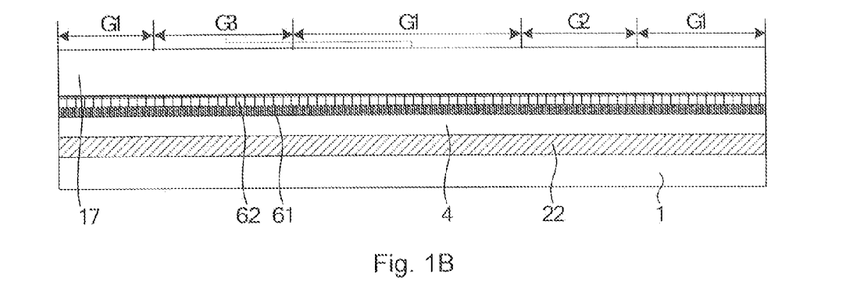
FIG. 1B is a cross-sectional view of the structure after applying a layer of photoresist in the manufacturing method for the array substrate according to the first embodiment of the disclosed technology.
Figure 1C:
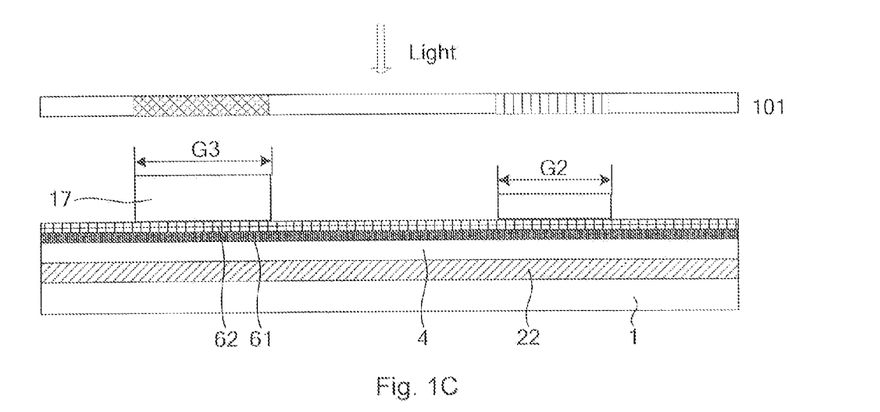
FIG. 1C is a cross-sectional view of the structure after the photoresist is exposed and developed in the manufacturing method for the array substrate according to the first embodiment of the disclosed technology.

FIG. 1B is a cross-sectional view of the structure after applying the photoresist in the manufacturing method for the array substrate according to the first embodiment of the disclosed technology, and FIG. 1C is a cross-sectional view of the structure after the photoresist is exposed and developed in the manufacturing method for the array substrate according to the first embodiment of the disclosed technology. As shown in FIGS. 1B and 1C, the photoresist 17 is applied on the active layer film, and is exposed and developed with a double tone mask 101, e.g., a grey tone mask, so as to form a photoresist pattern including the photoresist-completely-remained region G3, a photoresist-partially-remained region G2 and a photoresist-completely-removed region G1. The photoresistpartially-remained region G2 corresponds to the region for the gate line and the common electrode line, and the photoresist-completely-remained region G3 corresponds to the region for the gate electrode and the active layer (including the active layer channel).

Step 103, performing a first etching on the gate metal film, the gate insulating layer and the active layer film corresponding to the photoresist-completely-removed region, so as to form the gate electrode and the active layer.

Figure 1D:
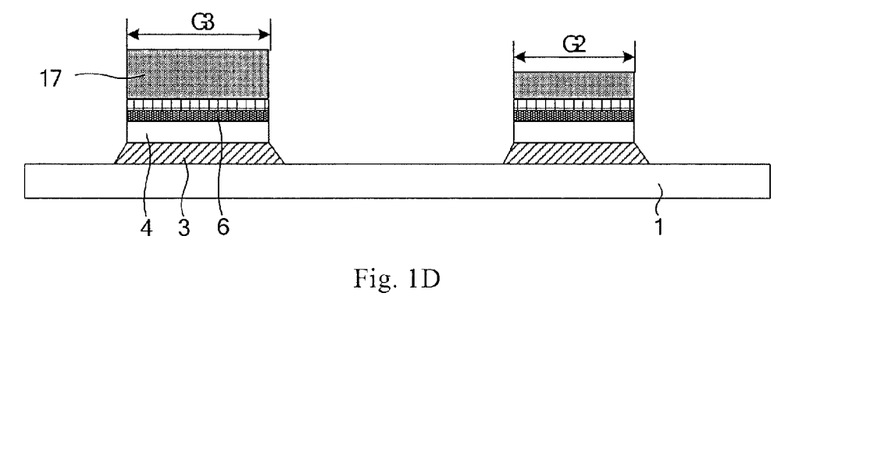
FIG. 1D is a cross-sectional view of the structure after a gate electrode is formed in the manufacturing method for the array substrate according to the first embodiment of the disclosed technology.

FIG. 1D is a cross-sectional view of the structure after the gate electrode is formed in the manufacturing method for the array substrate according to the first embodiment of the disclosed technology. As for the first etching, a dry etching may be firstly used to etch the active layer film and the gate insulating layer 4 corresponding to the photoresist-completely-removed region G1 of the photoresist 17, and then a wet etching is used to etch the gate metal film corresponding to the photoresist-completely-removed region G1 of the photoresist 17, so as to form a gate electrode 3 and an active layer 6 with a gate insulating layer 4 therebetween.

Step 104, ashing to remove the photoresist in the photoresist-partially-remained region and remain a part of photoresist with a certain thickness in the photoresist-completely-remained region, performing a second etching on the gate insulating layer and the active layer film in the photoresist-partially-remained region so as to form the gate line and the common electrode line.

Figure 1E:
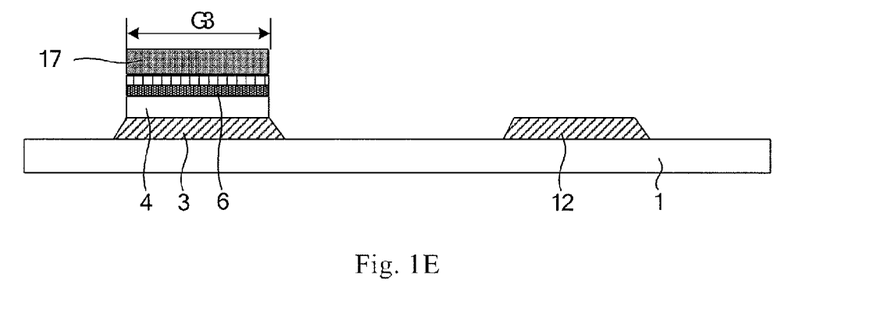
FIG. 1E is a cross-sectional view of the structure after a gate line and a common electrode line are formed in the manufacturing method for the array substrate according to the first embodiment of the disclosed technology.

FIG. 1E is a cross-sectional view of the structure after the gate line and the common electrode line are formed in the manufacturing method for the array substrate according to the first embodiment of the disclosed technology. Firstly, the photoresist is ashed with a dry etch by a thickness of the photoresist in the photoresist-partially-remained region G2 so as to remove the photoresist in the photoresist-partially-remained region G2. Then, the gate insulating layer and the active layer film corresponding to the photoresist-partially-remained region G2 are removed by a dry etch in the second etching, and the gate metal layer corresponding to the photoresist-partially-remained region G2 is left as the gate line (not illustrated) and the common electrode line 12. In the step, the remained photoresist 17 is left in the photoresist-completely-remained region G3 and needs not be lifted off.

Step 105, forming a first insulating layer film on the first base substrate with the above pattern.

Figure 1F:
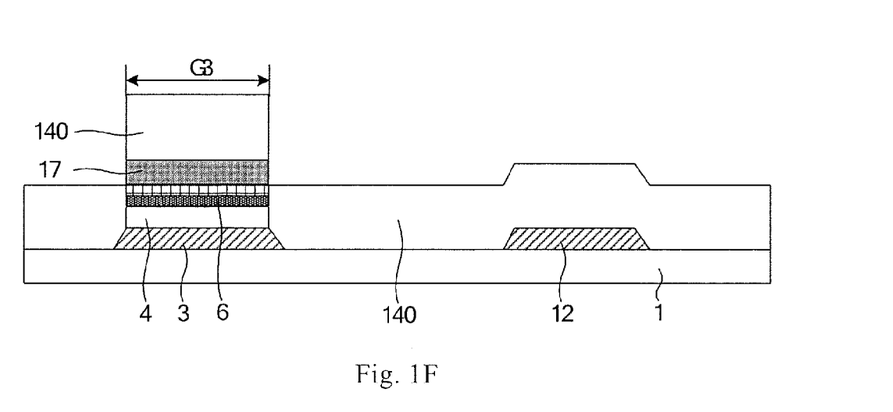
FIG. 1F is a cross-sectional view of the structure after a first insulating layer film is formed in the manufacturing method for the array substrate according to the first embodiment of the disclosed technology.

FIG. 1F is a cross-sectional view of the structure after the first insulating layer film is formed in the manufacturing method for the array substrate according to the first embodiment of the disclosed technology. The first insulating layer film 140 is deposited on the base substrate with the above patterns by a plasma enhanced chemical deposition (PECVD), and the remained photoresist 17 in the photoresist-completely-remained region G3 exists between the active layer 6 and the first insulating layer film 140.

Step 106, lifting off the photoresist in the photoresist-completely-remained region and the first insulating layer film thereon.

Figure 1G:
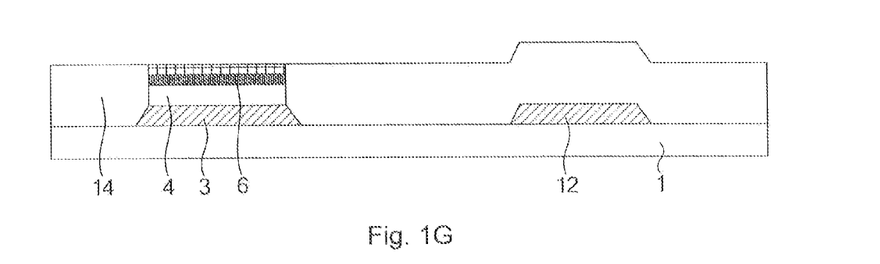
FIG. 1G is a cross-sectional view of the structure after the remaining photoresist in a photoresist-completely-remained region is lifted off in the manufacturing method for the array substrate according to the first embodiment of the disclosed technology.

FIG. 1G is a cross-sectional view of the structure after the remained photoresist in a photoresist-completely-remained region is lifted off in the manufacturing method for the array substrate according to the first embodiment of the disclosed technology. The photoresist 17 in the photoresist-completely-remained region G3 and the first insulating layer film 140 thereon are removed by a lifting-off process.

Step 107, forming a first conductive film on the first insulating layer film and the active layer, and patterning the first conductive film by a patterning process so as to from a source electrode, a drain electrode, a data electrode, a pixel electrode and an active layer channel.

Figure 1H:
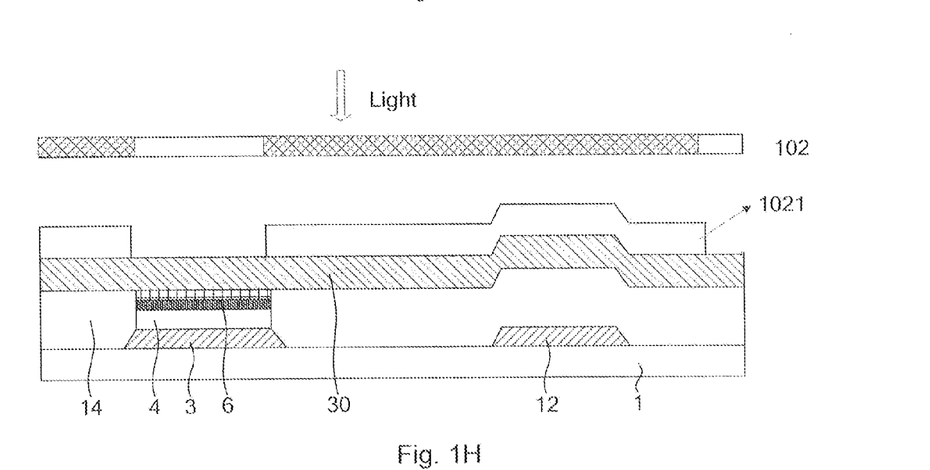
FIG. 1H is a cross-sectional view of the structure after a first conductive film is formed in the manufacturing method for the array substrate according to the first embodiment of the disclosed technology.
Figure 1I:
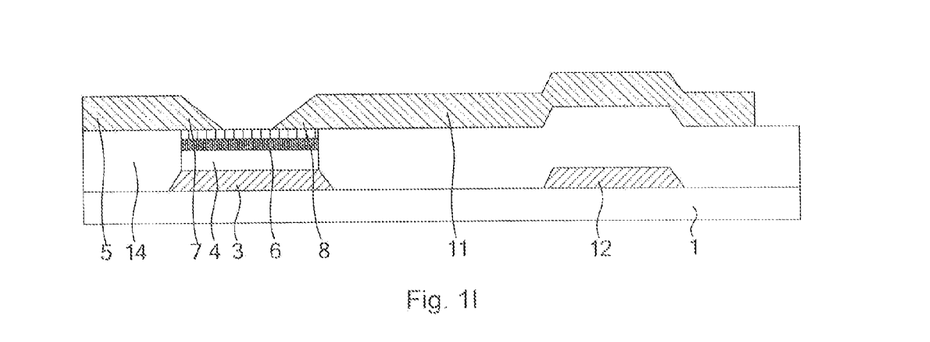
FIG. 1I is a cross-sectional view of the structure after a source electrode, a drain electrode, a data line and a pixel electrode are fainted in the manufacturing method for the array substrate according to the first embodiment of the disclosed technology.
Figure 1J:
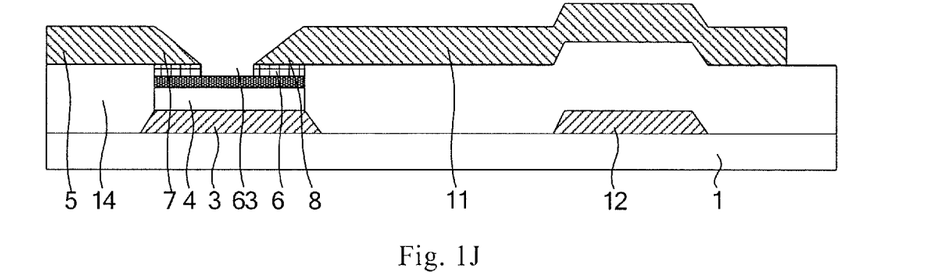
FIG. 1J is a cross-sectional view of the structure after an active layer channel is formed in the manufacturing method for the array substrate according to the first embodiment of the disclosed technology.

FIG. 1H is a cross-sectional view of the structure after the first conductive film is formed in the manufacturing method for the array substrate according to the first embodiment of the disclosed technology, FIG. 1I is a cross-sectional view of the structure after the source electrode, the drain electrode, the data line and the pixel electrode are formed in the manufacturing method for the array substrate according to the first embodiment of the disclosed technology, and FIG. 1J is a cross-sectional view of the structure after the active layer channel is formed in the manufacturing method for the array substrate according to the first embodiment of the disclosed technology. As shown in FIGS. 1H, 1I and 1J, the first conductive film (S/D layer) 30 is deposited by a sputtering method, a layer of photoresist is applied and then is exposed and developed with a single tone mask 102 so as to form a photoresist pattern 1021, and the first conductive film 30 is etched by a wet etch so as to form the source electrode 7, the drain electrode 8, the data line 5, the pixel electrode 11. The active layer 6 is subsequently etched by a dry etch so as to form the active layer channel 63 (it may be appropriately over-etched so as to ensure no doped semiconductor material is left in the active layer channel 63).

Step 108, forming a passivation layer on the base substrate formed with the above patterns.

Figure 1K:
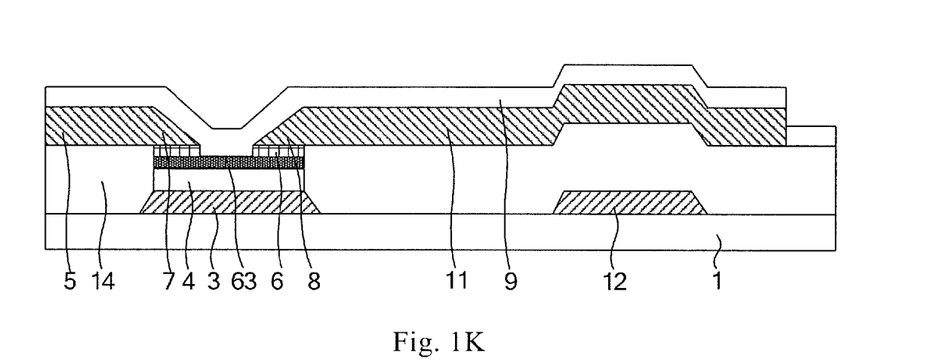
FIG. 1K is a cross-sectional view of the structure after a passivation layer is formed in the manufacturing method for the array substrate according to the first embodiment of the disclosed technology.

FIG. 1K is a cross-sectional view of the structure after the passivation layer is formed in the manufacturing method for the array substrate according to the first embodiment of the disclosed technology. As shown in FIG. 1K, a passivation layer 9 is deposited by a PECVD and is patterned so as form a pattern of the passivation layer which can expose the interface area.

The gate line, the common electrode line, the gate electrode, the gate insulating layer and the active layer can be formed in one masking process, and the array substrate can be manufactured by three masking processes, which simplifying the manufacturing procedure and reduce the manufacturing cost for the array substrate.

Second Embodiment

A manufacturing method for an array substrate according to the second embodiment of the disclosed technology is a modification based on the first embodiment. The array substrate made by the manufacturing method according to the second embodiment may be an array substrate for a reflection type active display. The method for forming the source electrode, the drain electrode, the data line, the pixel electrode and the active layer channel in Step 107 comprises the following steps.

Step 201, forming a data line metal film on the first insulating layer film as the first conductive film;

Step 202, patterning the data line metal film with a single tone mask so as to form a data line, a source electrode, a drain electrode and a pixel electrode, and forming an active layer channel by etching, the drain electrode and the pixel electrode being formed integrally.

Specifically, after a layer of photoresist is applied on the first conductive film, the photoresist on the first conductive film is exposed and developed with a single tone mask so as to form a photoresist-completely-remained region and a photoresist-completely-removed region, wherein, the photoresist-completely-remained region corresponds to the regions for the data line, the source electrode, the drain electrode and the pixel electrode, and the photoresist-completely-removed region corresponds to other regions (including the region for forming the active layer channel). The first conductive layer corresponding to the photoresist-completely-removed region is etched so as to from the data line, the source electrode, the drain electrode and the pixel electrode, and then a part of the active layer (the doped semiconductor layer and/or a part of the semiconductor layer) in the photoresist-completely-removed region is etched so as to form the active layer channel.

Figure 2:
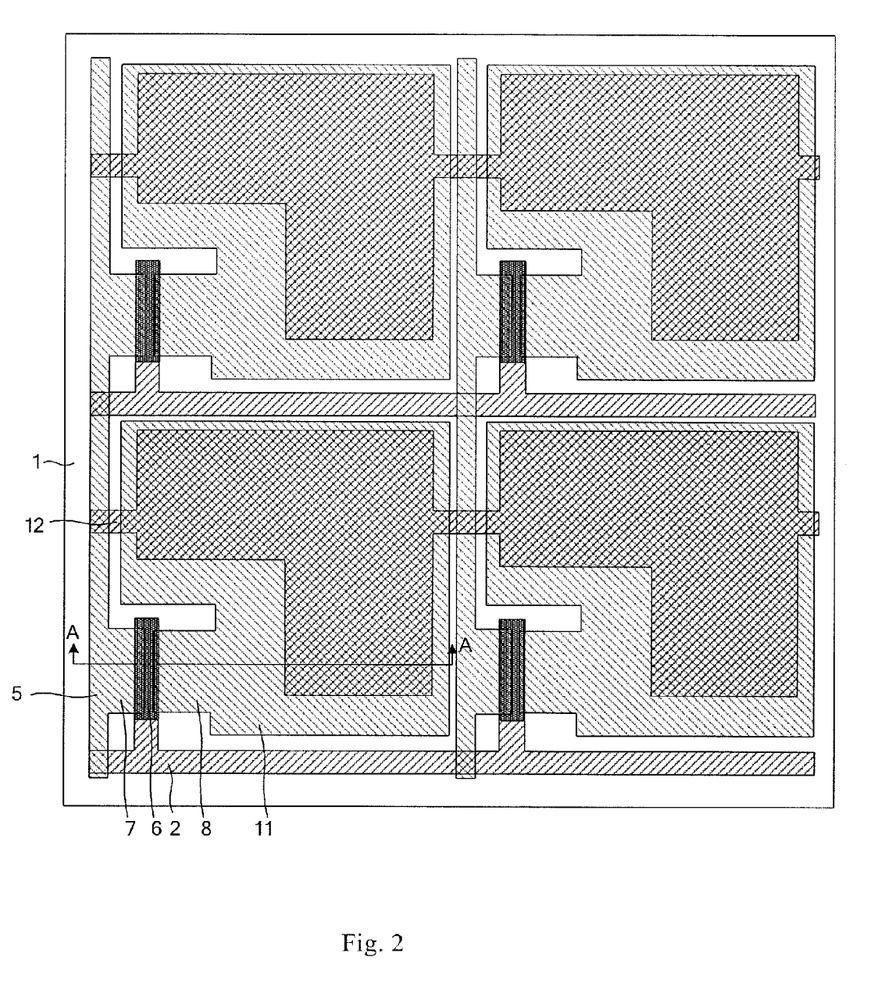
FIG. 2 is a partial top view of a structure after a pixel electrode is formed in a manufacturing method for an array substrate according to a second embodiment of the disclosed technology.

The manufacturing method for the array substrate according to the second embodiment can be applied to a electronic paper display. FIG. 2 is a partial top view of a structure after the pixel electrode is formed in the manufacturing method for the array substrate according to a second embodiment of the disclosed technology, and the cross-sectional structure along the line A-A in FIG. 2 can refer to FIG. 1J. As shown in FIGS. 2 and 1J, after the gate line 2, the gate electrode and the common electrode line 12 are formed in the first base substrate, the data line 5, the active layer 6, the source electrode 7, the drain electrode 8 and the pixel electrode 11 are formed by etching the data line metal film through the Step 201 and the Step 202. The formed drain electrode 8 and the pixel electrode 11 are integrated with each other and formed of the same material, i.e., the data line metal film, which may not be a transparent metal film.

The gate line, the gate electrode, the gate insulating layer and the active layer can be faulted in one masking process, and the array substrate can be manufactured by three masking processes, which simplifying the manufacturing procedure and reduce the manufacturing cost for the array substrate. In addition, the drain electrode and the pixel electrode are formed synchronously, integrally and with the same material, which reduces etching steps and further simplifies the manufacturing procedure and reduces the manufacturing cost. The manufacturing method can be applied to a reflection type active display, e.g., an electronic paper display.

Third Embodiment

A manufacturing method for an array substrate according to the third embodiment of the disclosed technology is a modification based on the first embodiment. The array substrate made by the manufacturing method according to the second embodiment may be an array substrate for a transmission type active display. The method for forming the source electrode, the drain electrode, the data line, the pixel electrode and the active layer channel in Step 107 comprises the following steps.

Step 301, forming a transparent conductive film and a data line metal film in order on the first insulating layer film as the first conductive film;

Step 302, applying a layer of photoresist on the first conductive film, and exposing and developing the photoresist with a double tone mask so as to from a photoresist pattern including a photoresist-completely-remained region, a photoresist-partially-remained region and a photoresist-completely-removed region, wherein, the photoresist-completely-remained region corresponds to a region for a source electrode, a drain electrode and a data line, the photoresist-partially-remained region corresponds to a region for a pixel electrode, and the photoresist-completely-removed region corresponds to other regions on the array substrate (including the region for forming the active layer channel);

Step 303, etching the transparent conductive film and the data line metal film corresponding to the photoresist-completely-removed region so as to form the source electrode, the drain electrode and the data line, and etching the active layer so as to form the active layer channel region;

Step 304, removing the photoresist in the photoresist-partially-remained region and remained a part of photoresist with a certain thickness in the photoresist-completely-remained region by an ashing process, etching the data line metal film corresponding to the photoresist-partially-remained region so as to form the pixel electrode.

Figure 3A:
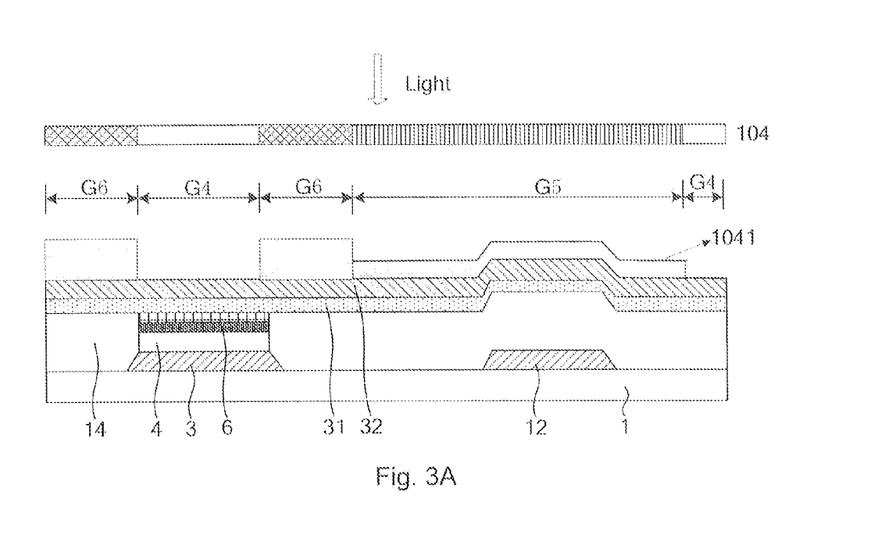
FIG. 3A is a cross-sectional view of a structure after a first conductive film is formed in a manufacturing method for an array substrate according to a third embodiment of the disclosed technology.
Figure 3B:
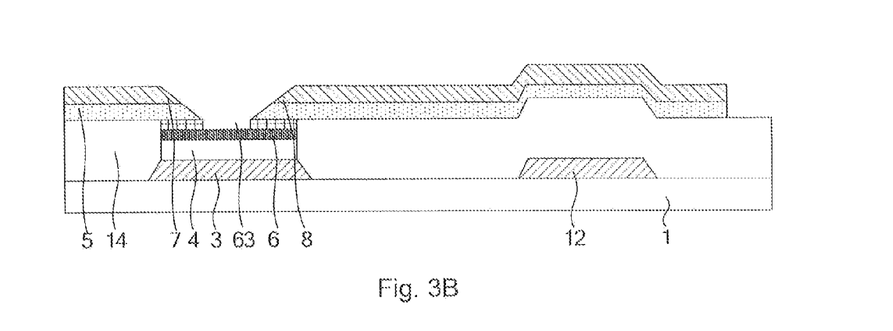
FIG. 3B is a cross-sectional view of a structure after a source electrode, a drain electrode, a data line and an active layer channel are formed in the manufacturing method for the array substrate according to the third embodiment of the disclosed technology.
Figure 3C:
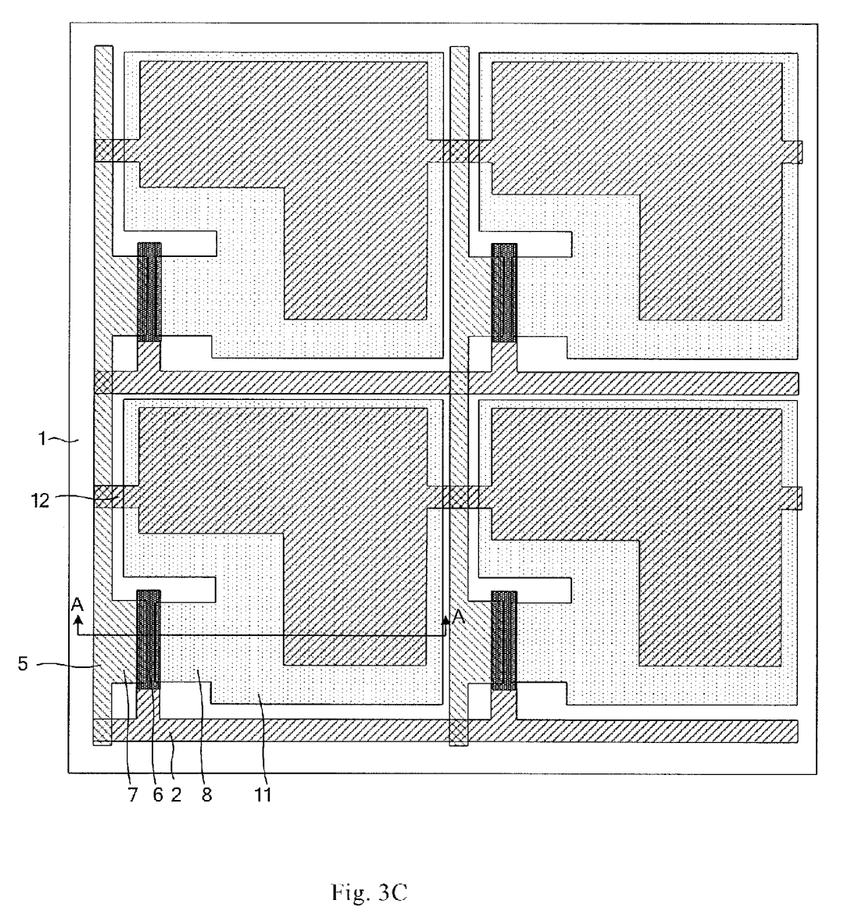
FIG. 3C is a partial top view of a structure after a pixel electrode is formed in the manufacturing method for the array substrate according to the third embodiment of the disclosed technology.
Figure 3D:
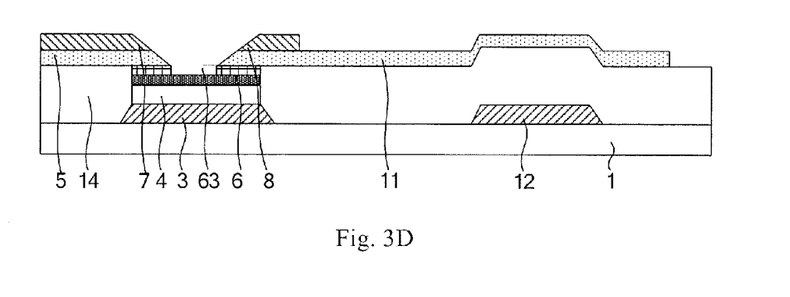
FIG. 3D is a cross-sectional view taken along a line A-A in FIG. 3C.

FIG. 3A is a cross-sectional view of a structure after the first conductive film is formed in the manufacturing method for the array substrate according to the third embodiment of the disclosed technology; FIG. 3B is a cross-sectional view of a structure after the source electrode, the drain electrode, the data line and the active layer channel are formed in the manufacturing method for the array substrate according to the third embodiment of the disclosed technology; FIG. 3C is a partial top view of a structure after the pixel electrode is formed in the manufacturing method for the array substrate according to the third embodiment of the disclosed technology; FIG. 3D is a cross-sectional view taken along a line A-A in FIG. 3C. As shown in FIGS. 3A and 3B, on the base substrate 1 formed with the gate line, the gate electrode 3, the common electrode line 12 and the first insulating layer 14, forming the first conductive layer with two layers including the transparent conductive film 31 and the data line metal film 32, wherein the transparent conductive film 31 is under the data line metal film 32. The photoresist on the data line metal film is exposed and developed with a double tone mask 104 so as to form the photoresist pattern 1041 including a photoresist-completely-remained region G6, a photoresist-partially-remained region G5 and a photoresist-completely-removed region G4, wherein, the photoresist-completely-remained region corresponds to the region for the source electrode, the drain electrode and the data line, the photoresist-partially-remained region corresponds to the region for a pixel electrode, and the photoresist-completely-removed region corresponds to other regions on the array substrate. The transparent conductive film and the data line metal film corresponding to the photoresist-completely-removed region are etched so as to form the source electrode 7, the drain electrode 8 and the data line 5, and the active layer 6 is etched so as to form the active layer channel. As shown in FIGS. 3C and 3D, the data line metal film corresponding to the photoresist-partially-remained region is etched so as to from the pixel electrode 11.

The gate line, the gate electrode, the gate insulating layer and the active layer can be formed in one masking process, and the array substrate can be manufactured by three masking processes, which simplifying the manufacturing procedure and reduce the manufacturing cost for the array substrate. In addition, the drain electrode and the pixel electrode are formed in different steps, and the material for the pixel electrode can be selected as a transparent conductive film so that the array substrate can be used in a transmission type active display.

Fourth Embodiment

Figure 4:
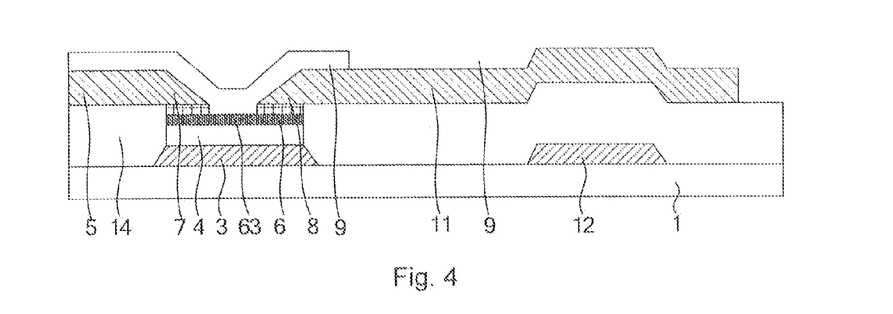
Figure 40:
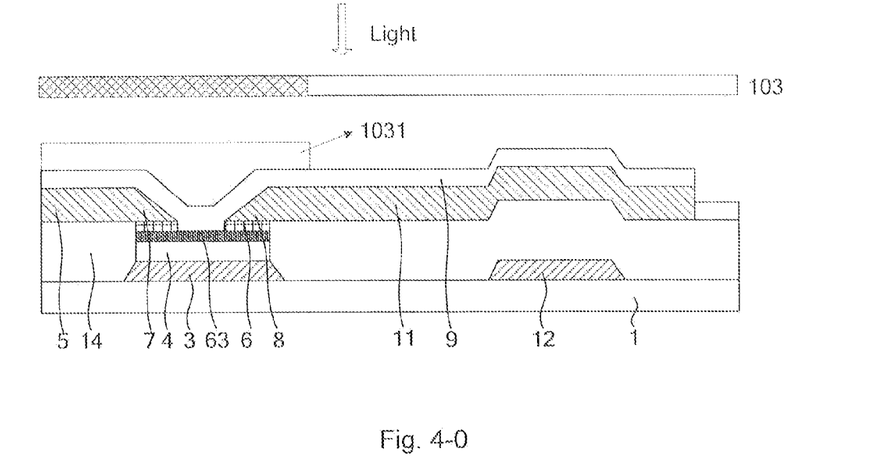

FIGS. 4-0 and 4 are cross-sectional views of a structure after a passivation layer is formed in a manufacturing method for an array substrate according to the fourth embodiment of the disclosed technology. Because the insulation performance of the passivation layer may not be good, so that a partial pressure may be generated. On the basis of the first, second and third embodiments, as shown in FIG. 4, the pixel electrode 11 can be exposed from the passivation layer 9 so as to reduce the passivation layer partial pressure. The method for forming the passivation layer on the first base substrate in Step 108 comprises the following steps.

Step 401, forming a passivation layer film on the base substrate with the above patterns;

Step 402, patterning the passivation layer film with a single tone mask 103 so as to expose the pixel electrode 11 and form the passivation layer.

Specifically, after a layer of photoresist is applied on the passivation layer film, the photoresist on the passivation layer film is exposed and developed with a single tone mask 103 so as to form a photoresist pattern 1031 including a photoresist-completely-remained region and a photoresist-completely-removed region, wherein, the photoresist-completely-removed region corresponding to the region of the pixel electrode, and the photoresist-completely-remained region corresponds to other regions on the array substrate. The passivation layer film corresponding to the photoresist-completely-removed region is etched so as to form a passivation layer 9 which expose the pixel electrode 11.

The gate line, the gate electrode, the gate insulating layer and the active layer can be formed in one masking process, and the array substrate can be manufactured by three masking processes, which simplifying the manufacturing procedure and reduce the manufacturing cost for the array substrate. In addition, the pixel electrode is exposed and not covered by the passivation layer, which can eliminate the partial pressure generated due to the passivation layer on the pixel electrode, reduce the power consumption for the operation of the array substrate and save energy.

Fifth Embodiment

Figure 5A:
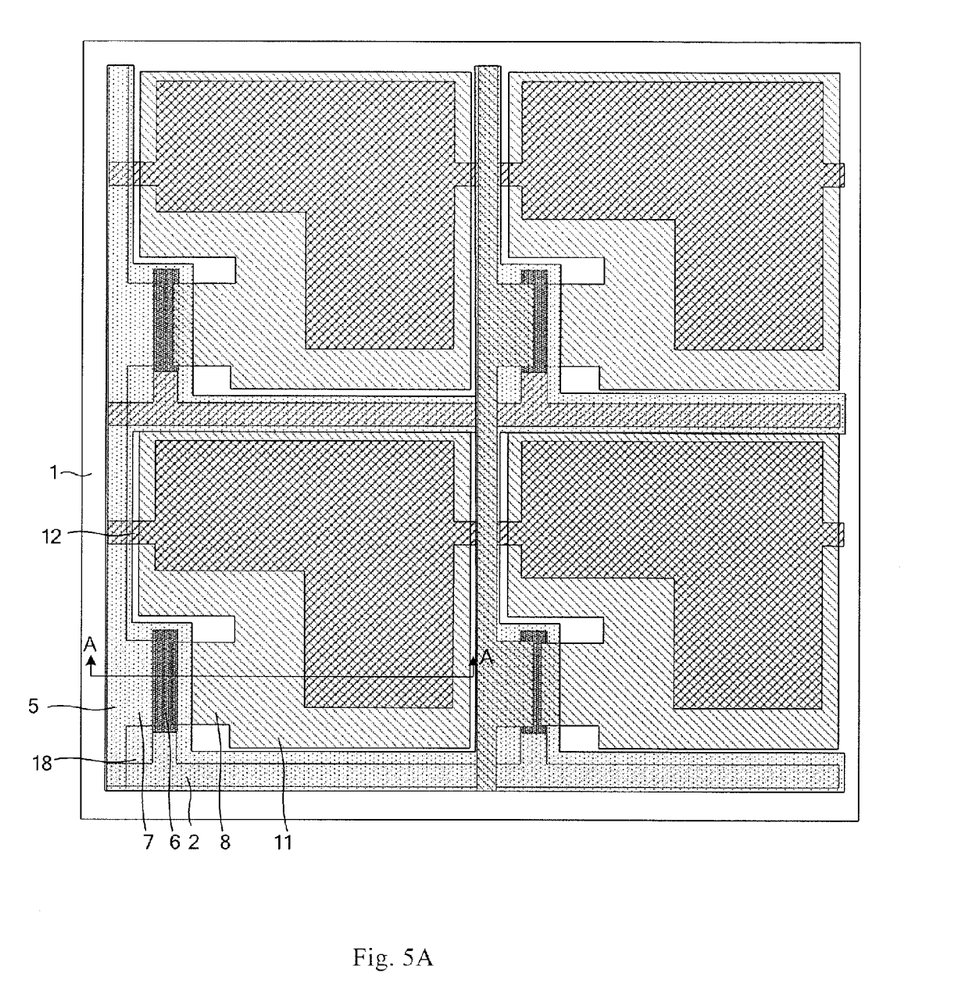
FIG. 5A is a partial top view of a structure after a passivation layer and a common electrode contact layer are formed in a manufacturing method for an array substrate according to a fifth embodiment of the disclosed technology.
Figure 5B:
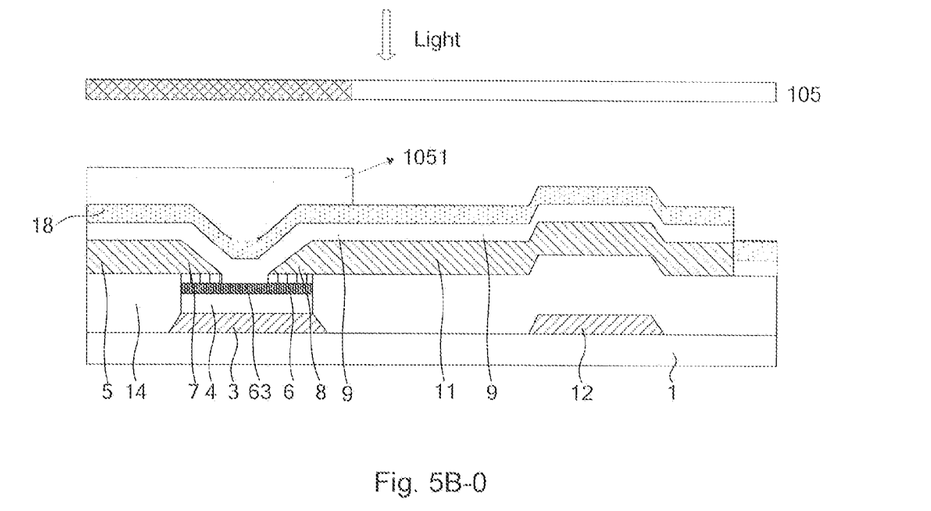
Figure 5B:
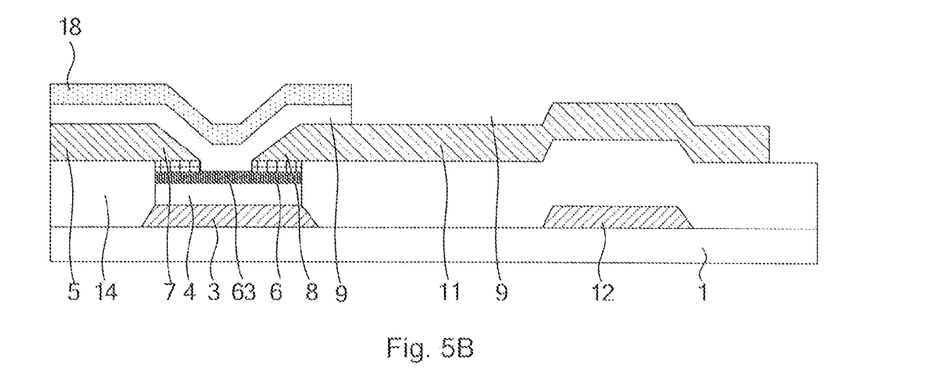

FIG. 5A is a partial top view of a structure after a passivation layer and a common electrode contact layer are formed in a manufacturing method for an array substrate according to the fifth embodiment of the disclosed technology; and FIGS. 5B-0 and 5B are cross-sectional views taken along a line A-A in FIG. 5A. On the basis of the first to fourth embodiments, as shown in FIGS. 5A and 5B, a common electrode contact layer 18 can be formed on the passivation layer 9 in order to decrease the influence of the electric filed between the pixel electrode and the common electrode on the displaying medium. The common electrode contact layer 18 and the passivation layer 9 can be formed synchronously, and the method for forming the passivation layer 9 and the common electrode contact layer 18 comprises the following steps.

Step 501, depositing a passivation layer film and a second conductive layer in order on the base substrate 1 with the above patterns;

Step 502, patterning the second conductive film and the passivation layer film with a single tone mask 105 so as to form the common electrode contact layer 18 and the passivation layer 9, wherein the common electrode contact layer 18 corresponds to the gate line 2, the gate electrode 3, the data line 5, the source electrode 7, the drain electrode 8 and the active layer 6, and the pixel electrode 11 is exposed from the passivation layer.

Specifically, the photoresist applied on the second conductive film is exposed and developed with a single tone mask 105 so as to form a photoresist pattern 1051, and the second conductive film corresponding to a photoresist-completely-removed region is firstly etched by a wet etch so as to form the common electrode contact layer 18; the passivation layer film is etched by a dry etch so as to form the passivation layer and expose the pixel electrode. The pattern of the common electrode contact layer 18 and the pattern of the passivation layer are consistent with each other, and the common electrode contact layer and the passivation layer cover the gate line 2, the gate electrode 3, the data line 5, the source electrode 7, the drain electrode 8 and the active layer 6. After the array substrate is bonded with an upper substrate, the common electrode 18 can be electrically connected with the common electrode on the upper substrate. A leading wire of the common electrode contact layer 18 can be lead out in a direction parallel to the gate line or the data line.

In addition, the formed passivation layer may have the same planar shape as that of the common electrode contact layer, i.e., corresponding to the gate line 2, the gate electrode 3, the data line 5, the source electrode 7, the drain electrode 8 and the active layer 6, and not covering the pixel electrode 11. Alternatively, the passivation layer may have the same planar as that of the passivation layers as in the first to three embodiments, i.e., covering the pixel electrode.

Further, the material for the second conductive film may be a transparent conductive material, e.g., indium tin oxides (ITO), and may also be opaque conductive material, e.g., metal or metal oxide film. The opaque conductive material may be the same as the material for the gate line or the data line.

The gate line, the gate electrode, the gate insulating layer and the active layer can be formed in one masking process, and the array substrate can be manufactured by three masking processes, which simplifying the manufacturing procedure and reduce the manufacturing cost for the array substrate. In addition, the pixel electrode is exposed and not covered by the passivation layer, which can eliminate the partial pressure generated due to the passivation layer on the pixel electrode, reduce the power consumption for the operation of the array substrate and save energy. The common electrode contact layer can be contacted with the common electrode on the upper substrate so as to be in the same potential, thus, the displaying medium above the common electrode contact layer will not experience a variation, which weakens the influence of the edge field between the pixel electrode and the common electrode on the displaying medium. In this case, even though no black matrix is disposed on the upper substrate, the gate line, the gate electrode, the data line, the source electrode, the drain electrode and the active layer on the substrate will not exert obvious interference on the displaying medium thereon, which improves the displaying performance of the active display, e.g., the electronic paper display.

Sixth Embodiment

The sixth embodiment of the disclosed technology provides an array substrate. As shown in FIGS. 1K and 2, the array substrate comprises a first base substrate 1, and a plurality of data lines 5 and a plurality of gate lines 2 crossed with each other so as to define a plurality of pixel units. Each of the pixel units comprises a pixel electrode 11, a gate electrode 3, a common electrode line 12, a source electrode 7, a drain electrode 8 and an active layer 6. A gate insulating layer 4 is formed between the gate electrode 3 and the active layer 6. A passivation layer 9 covers the data line 5, the source electrode 7, the drain electrode 8 and the active layer 6.

The gate electrode 3 is formed on the first base substrate, and the gate insulating layer 4, the active layer 6 and the gate electrode 3 have the same planar shape and are formed integrally and synchronously.

A first insulating layer 14 is formed on the based substrate 1 formed with the gate electrode 3, the gate insulating layer 4 and the active layer 6. The gate electrode 3, the gate insulating layer 4 and the active layer 6 are surrounded by the first insulating layer 14, and, at the adjacent portions of the first insulating layer 14 and the active layer 6, the surface of the first insulating layer 14 is level with the surface of the active layer 6.

The source electrode 7, the drain electrode 8, the data line 5 and the pixel electrode 11 are formed on the first insulating layer 14 and the active layer 6.

As for the array substrate according to the embodiment, the gate electrode, the gate insulating layer and the active layer have the same planar shape, and they can be formed integrally in one the same step with one mask, which simplifies the manufacturing procedure and reduces the manufacturing cost of the array substrate.

Seventh Embodiment

The seventh embodiment of the disclosed technology provides an array substrate. As shown in FIGS. 1J and 2, on the basis of the sixth embodiment, the array substrate can be used as an array substrate of a reflection type active display. The pixel electrode 11 is made of the same material as that of the source electrode 7, the drain electrode 8 and the data line 5, and the pixel electrode is formed integrally with the drain electrode. The pixel electrode of the array substrate may be formed used in the method described in the second embodiment. The array substrate of the seventh embodiment can be used in an electronic paper display.

As for the array substrate according to the embodiment, the gate electrode, the gate insulating layer and the active layer have the same planar shape, and they can be formed integrally in one the same step with one mask, which simplifies the manufacturing procedure and reduces the manufacturing cost of the array substrate. In addition, the pixel electrode is formed of the same material with the source electrode, the drain electrode and the data line and formed synchronously. The array substrate is suitable for a reflection type active display, e.g., an electronic paper display. For manufacturing the array substrate, the etching steps can be reduced, the manufacturing procedure is further simplified and the manufacturing cost is decreased.

Eighth Embodiment

The eighth embodiment of the disclosed technology provides an array substrate. As shown in FIGS. 3C and 3D, on the basis of the sixth embodiment, the array substrate can be used as an array substrate in a transmission type array substrate. The source electrode 7 and the drain electrode 8 comprise a lower layer of transparent conductive film and a upper layer of a data line metal film, and the pixel electrode 11 is composed of a transparent conductive film which is disposed in the same layer of the transparent conductive layer of the source electrode 7 and the drain electrode 8, and the transparent conductive layer of the pixel electrode 11 is connected with the transparent conductive layer of the drain electrode 8. The pixel electrode of the array substrate can be formed by the method described in the third embodiment.

As for the array substrate according to the embodiment, the gate electrode, the gate insulating layer and the active layer have the same planar shape, and they can be formed integrally in one the same step with one mask, which simplifies the manufacturing procedure and reduces the manufacturing cost of the array substrate. In addition, the drain electrode is formed with at least two laminated layers, and the lower layer in the laminated layers is formed of the same material as that of the pixel electrode and connected with the pixel electrode. The drain electrode and the pixel electrode can be formed in different steps, and the pixel electrode can be formed of a transparent conductive film, so that the array substrate can be used in a transmission type active display.

Ninth Embodiment

The ninth embodiment of the disclosed technology provides an array substrate. As shown in FIG. 4, on the basis of the sixth, seventh and eighth embodiments, the passivation layer can be disposed in a region other than the region of the pixel electrode 11, so that no partial pressure will be generated on the passivation layer on the pixel electrode.

Further, as shown in FIGS. 5A and 5B, a common electrode contact layer 18 can be disposed on the passivation layer, and the common electrode contact layer 18 corresponding to the gate line 2, the gate electrode 3, the data line 5, the source electrode 7, the drain electrode 8, and the active layer 6. By setting the common electrode contact layer 18 in a potential the same as that of the common electrode on the upper substrate, the influence of the electric filed between edges of the pixel electrode and the common electrode on the displaying medium can be reduced. The ways in which the common electrode contact layer and the common electrode are set in the same potential comprises the following methods: connecting the common electrode contact layer with the common electrode via a conductive medium, directly connecting the common electrode contact layer and the common electrode, or applying the same voltage on the common electrode contact layer and the common electrode, respectively.

Further, the material conductive material of the common electrode contact layer 18 may be transparent conductive layer or opaque conductive layer.

As for the array substrate according to the embodiment, the gate electrode, the gate insulating layer and the active layer have the same planar shape, and they can be formed integrally in one the same step with one mask, which simplifies the manufacturing procedure and reduces the manufacturing cost of the array substrate. In addition, the pixel electrode is exposed and not covered by the passivation layer, which can eliminate the partial pressure generated due to the passivation layer on the pixel electrode, reduce the power consumption for the operation of the array substrate and save energy. The common electrode contact layer can be set in the same potential as that of the common electrode on the upper substrate, the influence of the electronic field between edges of the pixel electrode and the common electrode on the displaying medium is weaken, and the displaying medium above the common electrode contact layer will not experience a variation. In this case, even though no black matrix is disposed on the upper substrate, the gate line, the gate electrode, the data line, the source electrode, the drain electrode and the active layer on the substrate will not exert obvious interference on the displaying medium thereon, which improves the displaying performance of the active display, e.g., the electronic paper display.

Tenth Embodiment

The tenth embodiment of the disclosed technology provides an active display comprising a upper substrate and any of the array substrate according to the embodiments of the disclosed technology which are boned with each other, and a displaying medium interposed between the upper substrate and the array substrate.

The displaying medium may be an electrophoresis displaying film or a polymer dispersed liquid crystal film.

Further, the upper substrate comprises a second base substrate.

The upper substrate may be a color filter substrate. In this case, the second base substrate of the upper substrate may be formed with a common electrode, a color filter resin and a black matrix. Alternatively, the upper substrate may not be a color filter substrate. In this case, the second base substrate of the upper substrate is only formed with a common electrode thereon without the color filter resin and the black matrix.

In addition, the active display may be an electronic paper display, and the material of the first base substrate of the array substrate and the second base substrate of the upper substrate may be flexible materials.

As for the array substrate in the active display according to the embodiment, the gate electrode, the gate insulating layer and the active layer have the same planar shape, and they can be formed integrally in one the same step with one mask, which simplifies the manufacturing procedure and reduces the manufacturing cost of the array substrate. In addition, the pixel electrode is exposed and not covered by the passivation layer, which can eliminate the partial pressure generated due to the passivation layer on the pixel electrode, reduce the power consumption for the operation of the array substrate and save energy. The common electrode contact layer can be set in the same potential as that of the common electrode on the upper substrate, the influence of the electronic field between edges of the pixel electrode and the common electrode on the displaying medium is weaken, and the displaying medium above the common electrode contact layer will not experience a variation. In this case, even though no black matrix is disposed on the upper substrate, the gate line, the gate electrode, the data line, the source electrode, the drain electrode and the active layer on the substrate will not exert obvious interference on the displaying medium thereon, which improves the displaying performance of the active display, e.g., the electronic paper display.

The array substrate of according to the embodiment of the disclosed technology may be manufactured by the manufacturing methods provided in the embodiments of the disclosed technology, and the pattern structures are formed correspondingly.

It should be noted that: the above embodiments only have a purpose of illustrating the disclosed technology, but not limiting it. Although the disclosed technology has been described with reference to the above embodiment, those skilled in the art should understand that modifications or alternations can be made to the solution or the technical feature in the described embodiments without departing from the spirit and scope of the disclosed technology.

What is claimed is:

1. A manufacturing method for an array substrate, comprising:

Step 1, sequentially forming a gate metal film, a gate insulating layer and an active layer film on a first base substrate;

Step 2, applying a layer of photoresist on the active layer film, and exposing and developing the photoresist by a double tone mask so as to form a photoresist-completely-remained region, a photoresist-partially-remained region and a photoresist-completely-removed region, the photoresist-completely-remained region corresponding to a region for a gate electrode and an active layer, the photoresist-partially-remained region corresponding to a region for a gate line and a common electrode line, and the photoresist-completely-removed region corresponds to other regions on the array substrate;

Step 3, performing a first etching on the gate metal film, the gate insulating layer and the active layer film corresponding to the photoresist-completely-removed region, so as to form the gate electrode and the active layer;

Step 4, ashing to remove the photoresist in the photoresist-partially-remained region and remain a part of the photoresist with a certain thickness in the photoresist-completely-remained region, performing a second etching on the gate insulating layer and the active layer film in the photoresist-partially-remained region so as to form the gate line and the common electrode line;

Step 5, forming a first insulating layer film on the first base substrate after Step 4;

Step 6, lifting off the photoresist in the photoresist-completely-remained region and the first insulating layer film thereon;

Step 7, forming a first conductive film on the first insulating layer film and the active layer, and patterning the first conductive film by a patterning process so as to from a source electrode, a drain electrode, a data line, a pixel electrode and an active layer channel; and Step 8, forming a passivation layer on the base substrate after the Step 7.

2. The manufacturing method for the array substrate of claim 1, wherein, the Step 7 comprises:

forming a data line metal film on the first insulating layer film and the active layer as the first conductive film; and patterning the data line metal film with a single tone mask so as to form the data line, the source electrode, the drain electrode and the pixel electrode, and forming the active layer channel by etching, the drain electrode and the pixel electrode being formed integrally.

3. The manufacturing method for the array substrate of claim 1, wherein, the Step 7 comprises:

forming a transparent conductive film and a data line metal film in order on the first insulating layer film as the first conductive film;

applying a layer of photoresist on the first conductive film, and exposing and developing the photoresist with a double tone mask so as to from a photoresist pattern including a photoresist-completely-remained region, a photoresist-partially-remained region and a photoresist-completely-removed region, the photoresist-completely-remained region corresponding to a region for the source electrode, the drain electrode and the data line, the photoresist-partially-remained region corresponds to a region for the pixel electrode, and the photoresist-completely-removed region corresponds to other regions on the array substrate;

etching the transparent conductive film and the data line metal film corresponding to the photoresist-completely-removed region so as to form the source electrode, the drain electrode and the data line, and etching a part of the active layer so as to form the active layer channel region; and removing the photoresist in the photoresist-partially-remained region and remaining a part of the photoresist with a certain thickness in the photoresist-completely-remained region by an ashing process, etching the data line metal film corresponding to the photoresist-partially-remained region so as to form the pixel electrode.

4. The manufacturing method for the array substrate of claim 1, wherein, the Step 8 comprises:

forming a passivation layer film on the base substrate after the Step 7; and patterning the passivation layer film with a single tone mask so as to expose the pixel electrode and form the passivation layer.

5. The manufacturing method for the array substrate of claim 1, wherein, a common electrode contact layer is further formed on the passivation layer, the Step 8 comprises:
  depositing a passivation layer film and a second conductive layer in order on the base substrate after the Step 7; and
  by a patterning process with a single tone mask, etching the second conductive film so as to form the common electrode contact layer which corresponds to the gate line, the gate electrode, the data line, the source electrode, the drain electrode and the active layer, etching the passivation layer film so as to from the passivation layer.

6. The manufacturing method for the array substrate of claim 2, wherein, a common electrode contact layer is further formed on the passivation layer, the Step 8 comprises:
  depositing a passivation layer film and a second conductive layer in order on the base substrate after the Step 7; and
  by a patterning process with a single tone mask, etching the second conductive film so as to form the common electrode contact layer which corresponds to the gate line, the gate electrode, the data line, the source electrode, the drain electrode and the active layer, etching the passivation layer film so as to from the passivation layer.

7. The manufacturing method for the array substrate of claim 5, wherein etching the passivation layer film so as to expose the pixel electrode.

\* \* \* \* \*